United States Patent [19]

Sato

[11] Patent Number: 5,304,972
[45] Date of Patent: Apr. 19, 1994

[54] SUPERCONDUCTING MAGNET APPARATUS HAVING CIRCULATING PATH FOR COOLANT

[75] Inventor: Akio Sato, Yokohama, Japan
[73] Assignee: Kabushiki Kaisha Toshiba, Kawasaki, Japan
[21] Appl. No.: 711,203
[22] Filed: Jun. 6, 1991

[30] Foreign Application Priority Data

Jun. 7, 1990 [JP] Japan .................................. 2-147473

[51] Int. Cl.⁵ .......................... H01L 39/00; H01F 7/22
[52] U.S. Cl. .......................................... 335/216; 62/15
[58] Field of Search ............... 335/216; 505/879, 892, 505/893, 898; 62/15.1, 15.2, 15.3

[56] References Cited

U.S. PATENT DOCUMENTS

| | | | |
|---|---|---|---|
| 3,363,207 | 1/1968 | Brechna | 62/51.3 |
| 4,578,962 | 4/1986 | Dustmann | 62/505 |
| 4,726,199 | 2/1988 | Takano et al. | 62/505 |

FOREIGN PATENT DOCUMENTS

| | | | |
|---|---|---|---|
| 1814783 | 7/1970 | Fed. Rep. of Germany . | |
| 2206841 | 9/1972 | Fed. Rep. of Germany . | |
| 0074906 | 6/1981 | Japan | 335/216 |
| 0202612 | 11/1984 | Japan | 335/216 |
| 0130178 | 7/1985 | Japan | 335/216 |
| 0164374 | 8/1985 | Japan | 335/216 |
| 0001209 | 1/1987 | Japan | 335/216 |
| 0054904 | 3/1987 | Japan | 335/216 |

*Primary Examiner*—Leo P. Picard
*Assistant Examiner*—Raymond Barrera
*Attorney, Agent, or Firm*—Oblon, Spivak, McClelland, Maier & Neustadt

[57] ABSTRACT

A superconducting coil incorporated in the superconducting magnet apparatus of the invention is shaped annular or cylindrical, and thus surrounds a photographing field. The coil has an axis which is substantially perpendicular to the line of gravity, i.e., extending in the horizontal direction. The coil is contained in a coolant vessel of a double structure filled with a coolant (e.g. liquid helium). Specifically, it is contained in a first coolant vessel, together with a predetermined small amount of liquid helium. The vessel has a receiving space defined therein and shaped similar to the coil. The space is large enough to receive the coil and the coolant with a predetermined gap. The coolant vessel comprises a first cylindrical wall contacting the inner periphery of the coil, a second cylindrical wall coaxial with the first cylindrical wall and having an inner diameter larger than the outer diameter of the coil and a pair of annular end walls arranged at both opposite ends of the first and second cylindrical walls, thereby closing, in a liquid-tight/airtight manner, the gap formed by the walls. That is, the coil is received, in a manner coaxial with the first and second cylindrical walls, in a receiving space defined by the cylindrical walls and annular end walls.

7 Claims, 3 Drawing Sheets

SUPERCONDUCTING MAGNET APPARATUS HAVING CIRCULATING PATH FOR COOLANT

BACKGROUND OF THE INVENTION

1. Field of the Invention

This invention relates to a superconducting magnet apparatus for use in a magnetic resonance tomographic diagnosing apparatus (i.e. MRI, NMR), which has a heat insulating structure such as a coolant circulating path.

2. Description of the Related Art

Most magnetic resonance tomographic diagnosing apparatuses obtain a magnetic field of required high intensity by means of superconducting magnets. A magnet apparatus employed in such a magnetic resonance tomographic diagnosing apparatus a has a magnetic field whose axis is substantially at right angles to the line of gravity (i.e. arranged in the horizontal direction), since a bed must be put into and out of the magnetic field, together with a patient lying thereon. The magnet apparatus is generally annular or cylindrical, and comprises a superconducting coil having an axis substantially perpendicular to the line of gravity, a cylindrical vessel containing liquid helium for cooling the coil, and a space (for accommodating a patient and the like) which has a shape similar to the superconducting coil, and houses the coil and vessel. The vessel is generally made of a non-magnetic material such as stainless steel. The vessel and super heat insulating layers covering the entire inner and outer surfaces form a cryostat.

To keep the superconducting coil in a stable superconducting state, it is desirable that the entire coil is always immersed in liquid helium. It is also desirable to resupply liquid helium after at least one month elapses since the last supply. To meet these, a great amount of liquid helium needs be stored in a position higher than the upper surface of the superconducting coil. To store a great amount of liquid helium in such a position, conventional superconducting magnetic apparatuses have been designed such that the above-described receiving space has an outer diameter and an inner diameter much smaller than the former.

This conventional apparatus, however, has the following problems:

Since its liquid helium vessel is obtained by setting large the difference between the inner and outer diameters, a great amount of liquid helium necessarily exists also in a position lower than the upper surface of the coil. Little of the liquid helium stored in the lower position is used effectively, i.e., liquid helium of an amount more than required is stored in the vessel. If the superconducting coil is quenched to a normal conducting state, the stored liquid helium will be abruptly vaporized. There is a dangerous case of a conventional apparatus whose liquid helium vessel was damaged due to an increase in pressure within the vessel. Further, from an economical point of view, this is disadvantageous to that scanner for scanning the entire body of a patient which requires as much as 200-300 l of expensive liquid helium.

To eliminate the above disadvantage, it is considered to reduce the amount of liquid helium stored in a position lower than the upper surface of the superconducting coil, by arranging the vessel to have an axis extending in a plane higher than that in which the axis of the coil extends. In this case, however, since the vessel made of a conductive material is asymmetry with respect to the axis of a gradient coil, which is excited pulsively, an ununiform eddy current will be caused along the vessel, providing distorted tomograms.

In summary, the conventional superconducting magnetic apparatus is disadvantageous in view of economy and safety, since it stores a coolant of an amount more than required, and since it may be damaged when an abnormality such as quenching of the superconducting coil occurs.

SUMMARY OF THE INVENTION

The object of the invention is to provide a superconducting magnet apparatus in which the amount of a coolant contained below the tip portion of the superconducting coil employed is reduced to a minimum necessary value without losing the symmetry to the gradient coil of the cryostat of MRI, thereby enhancing the economy and safety during operation.

To attain the object, the superconducting magnet apparatus, having a superconducting coil which is shaped annular or cylindrical and has an axis substantially perpendicular to the line of the gravity, comprises:

a first coolant vessel having a receiving space defined therein and shaped similar to the superconducting coil, the space receiving the coil and a coolant of extremely low temperature for cooling the coil;

a second coolant vessel arranged outside the first coolant vessel and coaxial therewith, and having a receiving space defined therein and located above the axis of the coil, for receiving the coolant; and a coolant path communicating the receiving space of the first coolant vessel with that of the second coolant vessel.

The superconducting magnet apparatus constructed as above can store a coolant, required for operating the apparatus for a long time, in the space defined in the second coolant vessel, so that the space defined in the first coolant vessel ma have a minimum possible size capable of receiving the superconducting coil with a predetermined gap. Thus, the apparatus can operate for a long time with a minimum necessary amount of coolant. Further, the coil is coaxial with the first and second coolant vessels, which results in the axial symmetry of the apparatus. Therefore, if, for example, a magnetic resonance tomographic diagnosing apparatus (MRI) uses a superconducting magnet apparatus constructed as above, it will provide tomograms free from distortion.

In addition, in a case where an abnormality occurs, and the superconductive state is shifted to a normal conductive state, the coolant contained in the first coolant vessel starts to vaporize at first, and then the coolant contained in the second coolant vessel starts to vaporize slowly, which prevents the coolant from abruptly increasing in pressure.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

The superconducting magnet apparatus according to an embodiment of the invention and shown in FIG. 1 has indispensable components such as a power lead for energizing or deenergizing a superconducting coil, hereinafter referred to, a permanent current switch for enabling the coil to operate in permanent current mode, a line for supplying a coolant, a supporting mechanism supporting the superconducting coil and a coolant vessel, hereinafter referred to, a heat-shielding plate for shielding the vessel from radiation heat, and a vacuum vessel. However, the essence of the present invention can be explained without referring to those components, and therefore they are not shown in the figure and not explained here.

Figure 1:
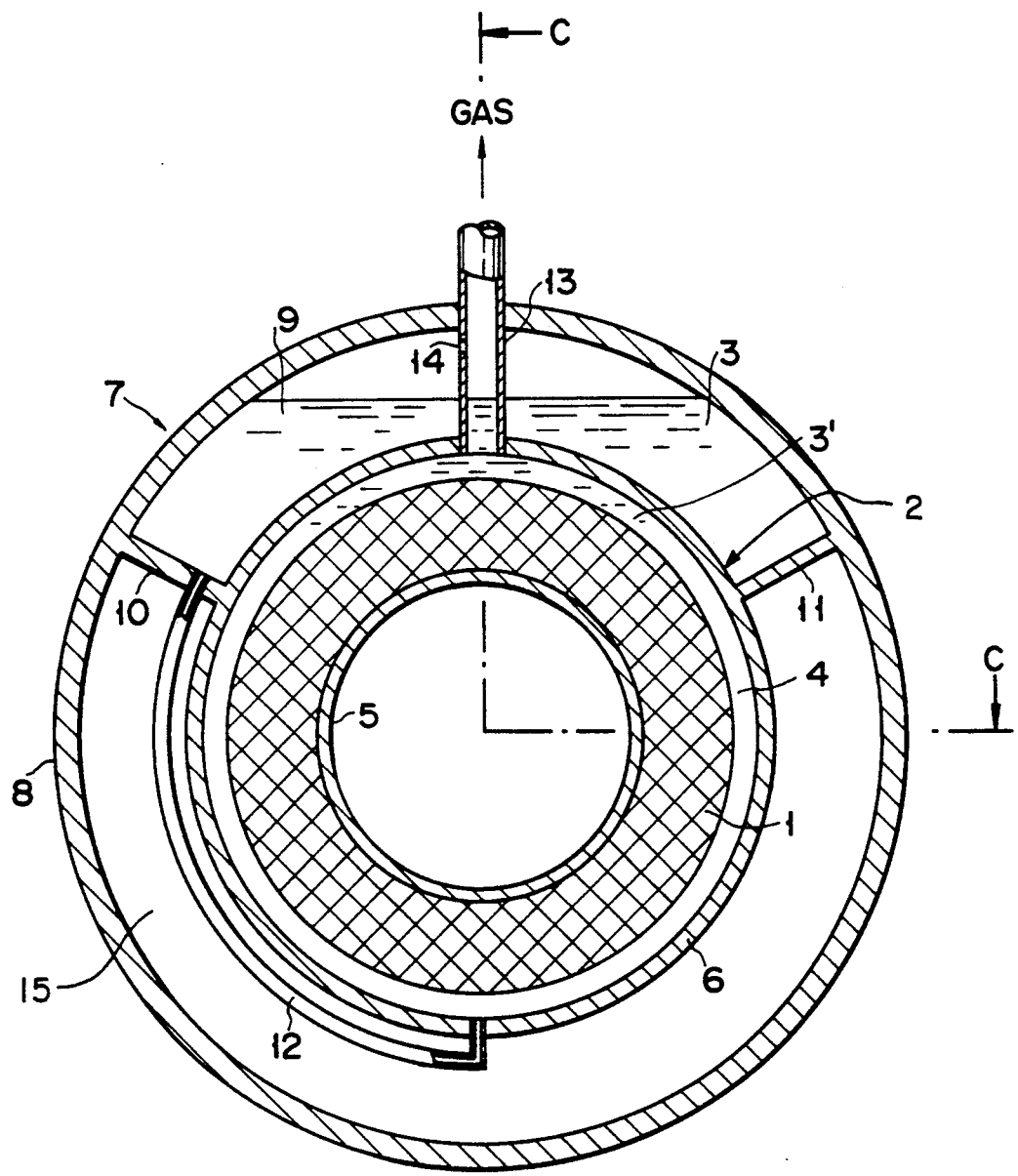
FIG. 1 is a transverse sectional view showing an essential part of a superconducting magnet apparatus according to an embodiment of the invention.

As is shown in FIG. 1, a superconducting coil 1 is shaped annular or cylindrical, thereby defining a photographing field therein. The axis of the coil 1 is arranged substantially at right angles to the line of gravity, i.e., arranged in the horizontal direction. The coil 1 is received in a double-structure vessel filled with liquid helium. Specifically, the coil is received in a first coolant vessel 2, together with a predetermined small amount of liquid helium 3'. The vessel 2 is made of a nonmagnetic material such as stainless steel, and has a receiving space 4 defined therein. The space 4 is shaped similar to the coil 1 and is large enough to receive the coil with a predetermined gap (capable of storing a predetermined amount of liquid helium). That is, the vessel 2 comprises a first cylindrical wall 5 being in contact with the inner peripheral surface of the coil 1, a second cylindrical wall 6 (which serves also as the inner wall of a second vessel, hereinafter referred to) arranged coaxial with the first cylindrical wall 5, and a pair of annular end walls (not shown) arranged at opposite ends of the walls 5 and 6. The annular end walls close a liquidtight/airtight manner, the gap defined by the walls 5 and 6, thereby forming the receiving space 4. Thus, the coil 1 is arranged coaxial with the cylindrical walls 5 and 6.

A second coolant vessel 7 is provided around and coaxial with the first coolant vessel 2, and is made of a non-magnetic material such as stainless steel. The vessel 7 comprises the second cylindrical wall 6, a third cylindrical wall 8 arranged coaxial with the wall 6, a pair of annular end walls (not shown). These cylindrical and end walls define a liquidtight annular space, and this space is divided by means of separating walls 10 and 11 into an upper space 9 for receiving liquid helium 3, and a lower space 15. The walls 10 and 11 extend radially, and are located above the axis of the vessel. A bottom region of the space 9 is communicated with a bottom region of the space 4 through a communication pipe 12.

A vaporized gas collecting pipe 13 extends, between the space 4 and the outside, through the tip portion of the wall 6, also through the upper space 9, and through the tip portion of the wall 8. A hole 14 for guiding vapor (i.e., helium gas) generated in the space 9 into the pipe 13 is formed in that portion of the pipe 13 which is located in the space 9.

In the vessel constructed as above, liquid helium 3 required for operating the apparatus for a long time can be stored in the space 9 formed above the second vessel 7 at all times in a recycling manner. Thus, the space 4 of the first vessel 2 may have a minimum possible size capable of receiving the superconducting coil 1 with a predetermined gap. Therefore, the apparatus can operate for a long time with a minimum necessary amount of liquid helium. That is, maintenance free operation can be performed for a long time without storing liquid helium in the vacant space 15 defined by the separating walls 10 and 11 and the cylindrical wall 6. Further, since the superconducting coil 1 is coaxial with the first and second vessels 2 and 7, the superconducting magnet apparatus is symmetric to the gradient magnetic field.

Consequently, a magnetic resonance tomographic diagnosing apparatus incorporating the above-described superconducting magnet apparatus can provide a tomogram without distortion.

Further, in the apparatus of the invention, when an abnormality occurs and the superconducting coil 1 is quenched to a normal conducting state, the liquid helium 3' contained in the first vessel 2 starts to vaporize, and the liquid helium 3 contained in the space 9 of the second vessel 7 slowly starts to vaporize long after the start of vaporization of the liquid helium 3'. Thus, an abrupt increase in pressure in the vessels is prevented, which is advantageous in view of safety.

Figure 2:
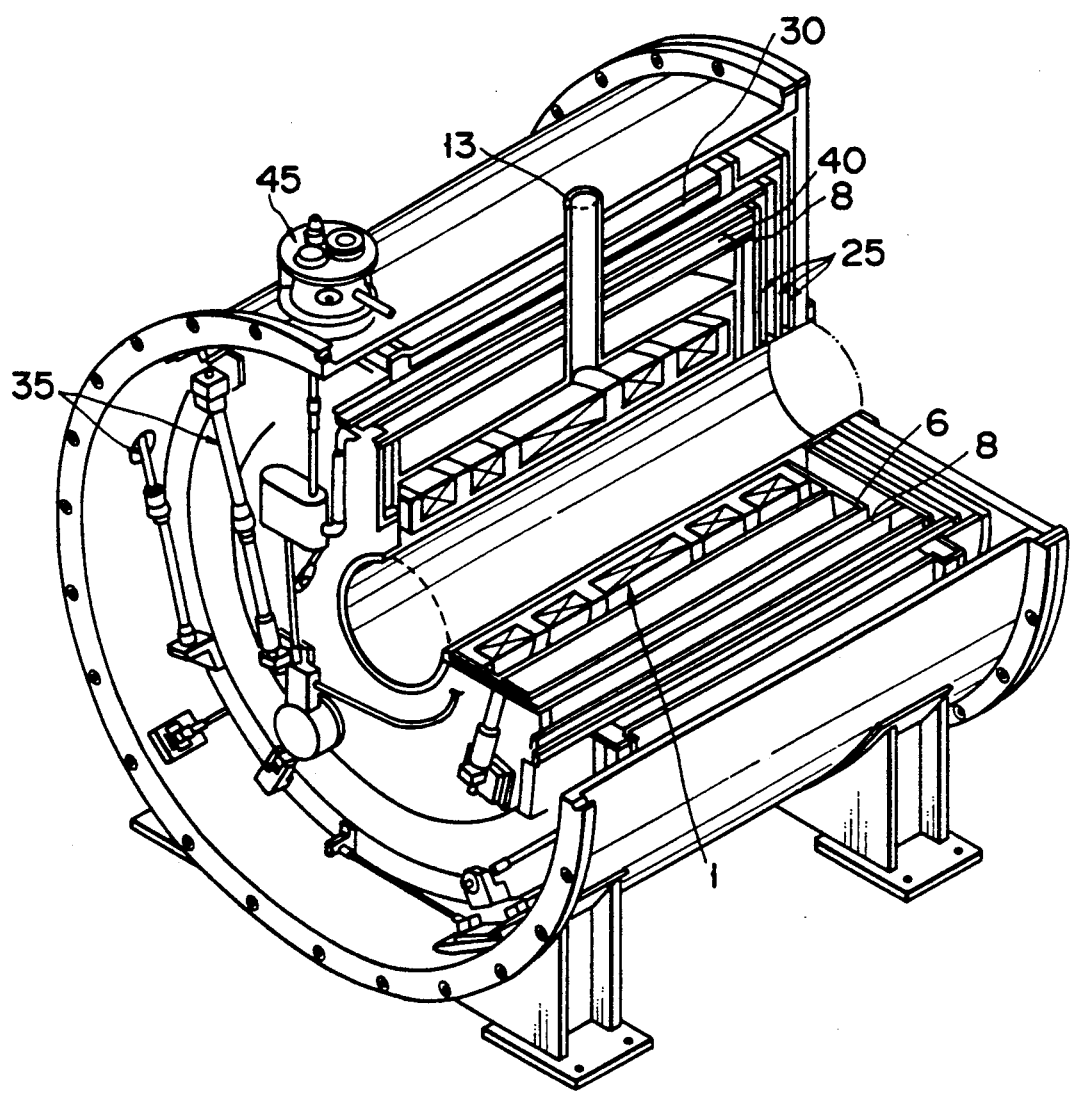
FIG. 2 is a partially cutaway view of the apparatus of the invention.

FIG. 2 is a partial cutaway view of the superconducting magnet apparatus of the invention, showing a detailed cross section thereof.

The actual superconducting magnet apparatus includes components other than those shown in FIG. 1, such as thermal shielding layers 25 which cover the coil-receiving space and the coil, have various thicknesses, and are made of various materials, also complex layers defining spaces (a nitrogen tank 30, helium tank 40, etc.) for receiving coolants such as liquid helium and nitrogen, and coolant-circulation paths. The shielding layers 25, tank 30, and tank 40 and the other components, which are located in the area in which the magnetic force is exerted, are thin walls made of non-magnetic materials such as aluminum and high manganese steel. These thin walls form a predetermined structure. As can be understood from FIG. 2, the apparatus further incorporates a load supporting member 35, an inlet 45 for a coolant and the like, etc.

Figure 3:
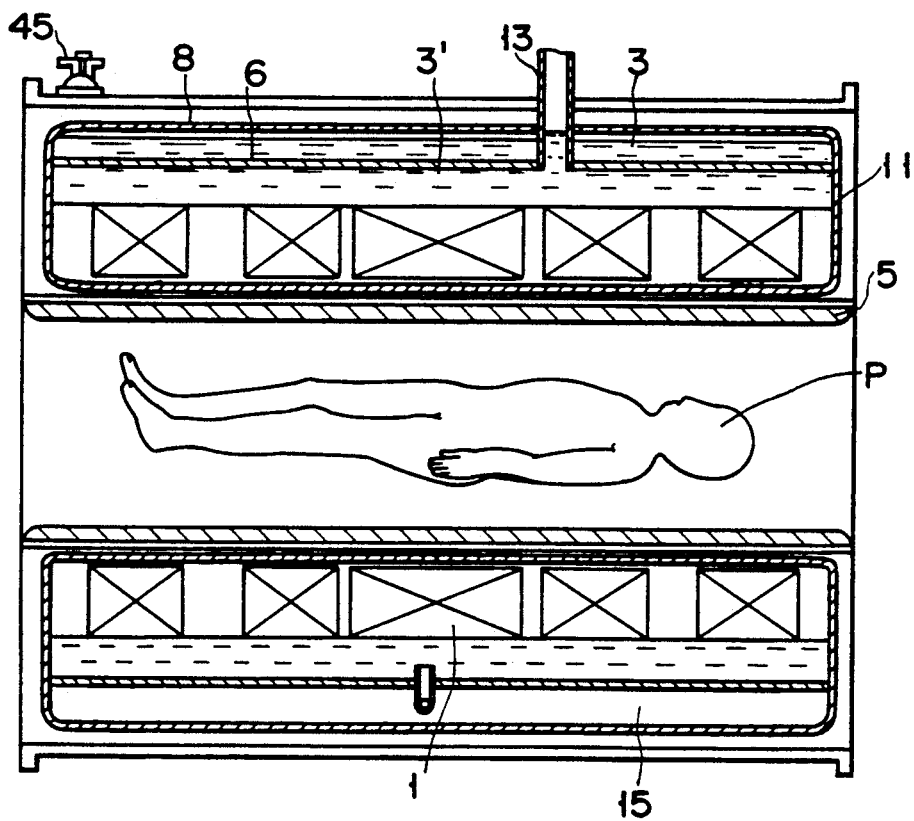
FIG. 3 is a longitudinal sectional view of the apparatus of the invention.

FIG. 3 shows a longitudinal cross section of the superconducting magnet apparatus with a patient P lying therein. The layers (the shielding layers, nitrogen tank 30, and helium tank 40) forming the structure for cooling and thermal insulation surround a plurality of superconducting magnets (coils 1). The liquid helium 3 is contained in the portion located above the separating wall 11. This liquid helium 3 can flow into the space defined by the cylindrical wall 6 and filled with the liquid helium 3', through the communication pipe 12 (shown in FIG. 1). The liquid helium 3' heated by the superconducting coils 1 becomes helium gas, and exhausted from the gas collecting pipe 13. Thus, the liquid helium 3 and 3' are gradually decreased in amount. The superconducting coils 1 are therefore cooled to a desired temperature. The space located below the separating wall 11 is maintained in a vacuum state.

As is evident from FIG. 3, the patient P is positioned in the magnetic axis of the apparatus, indicated by the one-dot chain line. The apparatus is shaped symmetrical so that a substantially circular magnetic field will be formed around the magnetic axis. Further, the apparatus may be constructed such that each magnetic coil is surrounded by multi layers. In this case, the apparatus is more complex in structure than that of the embodiment, but has a cooling efficiency higher than the latter.

The present invention is not limited to the above-described embodiment. It is a matter of course that the invention is applicable also to an apparatus incorporating a superconducting coil to be cooled by liquid nitrogen or oxygen, in place of the superconducting coil to be cooled by liquid helium.

As is explained above, the superconducting magnet apparatus of the invention can operate for a long time in a reliable manner with a small amount of coolant, and also can provide an undistorted tomogram.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A superconducting magnet apparatus having a superconducting coil shaped annularly, the coil having an axis substantially perpendicular to the line of a direction in which gravity acts, the apparatus comprising:
   a first coolant vessel having a receiving space defined therein and conforming in shape to the superconducting coil, the receiving space of said first coolant vessel receiving the coil and a coolant of extremely low temperature for cooling the coil;
   a second coolant vessel arranged outside the first coolant vessel and coaxial therewith, and having a receiving space separated therein by wall means located above or at a level of the axis of the coil, the receiving space of the second coolant vessel being located above the axis of the coil, for receiving the coolant, wherein an axis of the second coolant vessel coincides with an axis of the first coolant vessel; and
   a coolant communication pipe communicating a bottom region of the receiving space of the second coolant vessel with a bottom region of the receiving space of the first coolant vessel.

2. The superconducting magnet apparatus according to claim 1, further comprising a gas collecting pipe extending through the receiving space of the second coolant vessel and communicating the receiving space of the first coolant vessel with the outside.

3. The superconducting magnet apparatus according to claim 1, wherein the second coolant vessel has two separating walls extending radially and forming the receiving space of said second coolant vessel.

4. The superconducting magnet apparatus according to claim 3, wherein the separating walls are located above or at the level of the axis of the coolant vessels, and said coolant communication pipe extends through at least one of the separating walls, extends downward in a space separated by the separating walls, and through a wall of the first coolant vessel at its bottom.

5. The superconducting magnet apparatus according to claim 3, further comprising at least one gas exhausting pipe extending through edge portions of the first and second coolant vessels which are located in a vertical line passing through the axis of the vessels.

6. A cylindrical superconducting magnet apparatus of a double structure, having a superconducting coil shaped annularly and having a first space defined therein for accommodating an object to be examined, a first vessel receiving the superconducting coil, and a second vessel arranged outside the first vessel,
   wherein the apparatus is arranged such that the first and second vessels are coaxial with each other, and also with an object lying in said first space,
   and comprising:
   at least two walls extending radially for dividing a second space defined by walls forming the first and second vessels into upper and lower spaces;
   path means communicating the first and second vessels with each other; and
   at least one gas collecting means for exhausting vaporized coolant, which extends, between the first vessel and the outside, through edge portions of the walls of the first and second vessels;
   a coolant being stored in the upper space and the first vessel, the coolant stored in the upper space being able to flow into the first vessel.

7. A superconducting magnet apparatus having a superconducting coil shaped annularly, the coil having an axis substantially perpendicular to the line of a direction in which gravity acts, the apparatus comprising:
   a first coolant vessel having a receiving space defined therein and conforming in shape to the superconducting coil, the space of the first coolant vessel receiving the coil and a coolant of extremely low temperature for cooling the coil;
   a second coolant vessel arranged outside the first coolant vessel and coaxial therewith, the second coolant vessel having a vacuum state space and a receiving space for receiving the coolant, wherein an axis of the second coolant vessel coincides with an axis of the first coolant vessel; and
   a coolant communicating pipe located in the vacuum state space communicating a bottom region of the receiving space of the second coolant vessel with a bottom region of the receiving space of the first coolant vessel.

* * * * *